(12) United States Patent
Lee et al.

(10) Patent No.: US 6,670,224 B2
(45) Date of Patent: Dec. 30, 2003

(54) METHOD FOR MANUFACTURING THIN FILM TRANSISTORS

(75) Inventors: Chi-shen Lee, Hsinchu (TW); Ting-Kuo Chang, Hsinchu (TW); Pi-Fu Chen, Taipei Hsien (TW); Yu-Ming Kang, Chupei (TW); Yuan-Tung Dai, Chung Li (TW)

(73) Assignee: Industrial Technology Research Institute, Hsinchu (TW)

( * ) Notice: Subject to any disclaimer, the term of this patent is extended or adjusted under 35 U.S.C. 154(b) by 30 days.

(21) Appl. No.: 10/033,934

(22) Filed: Jan. 3, 2002

(65) Prior Publication Data

US 2003/0124781 A1 Jul. 3, 2003

(51) Int. Cl.[7] .......................... H01L 21/00; H01L 21/84
(52) U.S. Cl. ...................... 438/160; 438/166; 257/347
(58) Field of Search ............................... 438/160, 166

(56) References Cited

U.S. PATENT DOCUMENTS

| | | | | |
|---|---|---|---|---|
| 5,753,541 A | * | 5/1998 | Shimizu | 438/161 |
| 6,410,368 B1 | * | 6/2002 | Kawasaki et al. | 438/145 |
| 2002/0066931 A1 | * | 6/2002 | Tamura et al. | 257/359 |

* cited by examiner

Primary Examiner—William David Coleman
(74) Attorney, Agent, or Firm—Sughrue Mion, PLLC (57) ABSTRACT

A manufacturing method of a thin film transistor (TFT) having low serial impedance is described. The method uses a back-side exposure and uses the active area as a hard mask; therefore, photomask usage may be reduced. On the other hand, a Si-Ge layer is used to react with the conductive layer deposited thereon after for forming a Ge-salicide layer. The method may reduce the required temperature of forming a Ge-salicide layer and the serial impedance.

31 Claims, 7 Drawing Sheets

Fig. 13

METHOD FOR MANUFACTURING THIN FILM TRANSISTORS

FIELD OF THE INVENTION

The present invention relates to a method of fabricating transistors, and especially to a method of fabricating self-aligned and having low serial impedance thin film transistors.

BACKGROUND OF THE INVENTION

Recently, the requirements of lower power consumption and lighter weight have driven the rapid progress of optical technology. Liquid crystal displays (LCD) have been widely applied in electrical products, such as digital watches, calculators, etc. for a long time. Moreover, with the advance of techniques for manufacture and design, thin film transistors-liquid crystal display (TFT-LCD) have been introduced into portable computers, personal digital assistants, color televisions, and replaced gradually the kinescopes that are used for conventional displays.

Thin film transistor-liquid crystal displays (TFT-LCD) are one of various popular merchandises in the LCD field and have received much attention. In general, the TFT-LCD comprises a bottom plate on which are formed thin film transistors and pixel electrodes, and a top plate on which are constructed color filters. The liquid crystal molecules fill the space between the top plate and the bottom plate. In the operation, a signal voltage is applied to the TFT that is the switching element of each unit pixel. The TFT receives the signal voltage and turns on so that data voltage carrying image information can be applied to the corresponding pixel electrode and the liquid crystal via the TFT. When the data voltage is applied to the TFT, the arrangement of the liquid crystal molecules is changed, thereby changing the optical properties and displaying the image.

A reduction of photolithography processes in manufacturing TFT devices is necessary to decrease the process cycle time and cost. Namely, it is better to reduce the number of photomasks used in forming TFT devices. According to the prior art of manufacturing the TFT device for a TFT-LCD, two or more photomasks are needed to define the active area and gate electrode. This increases not only the process cycle time and cost required manufacture the TFT device but also the opportunity for misalignment between the active area and gate electrode.

On the other hand, it is necessary for manufacturing TFT devices to have the lower serial impedance for reducing the power loss among the source/gate/drain electrode. The conventional method for reducing the impedance is to form a salicide layer over the source/gate/drain electrode. In this process a metal layer is deposited over the source/gate/drain electrode and then a thermal process is performed to make the silicon portion of the source/gate/drain electrode react with the metal. However, a temperature of over 500° C. is required to manufacture low impedance salicide. This kind of process temperature breaks the glass substrate.

SUMMARY OF THE INVENTION

A higher number of photomasks used in manufacturing TFT requires more process cycle time and cost. The risk of misalignment also increases. Therefore, the main purpose of the present invention is to provide a method for manufacturing a self-aligned TFT-LCD apparatus. This present invention performs a back-side exposure using the active area as a mask to form the gate electrode. Only one photomask is needed to manufacture a TFT apparatus. Therefore, the present invention method may reduce costs and eliminate the misalignment risk.

The second objective of the present invention is to provide a Si-Ge layer to react with the metal layer deposited thereon for subsequent formation of a Ge-salicide having a low impedance. This kind of method may reduce the reaction temperature and resolve the high serial impedance problem.

In accordance with the foregoing purpose, the present invention discloses a manufacturing method of a TFT apparatus having low impedance. This method uses a back-side exposure process that only needs one photomask to form a TFT apparatus. On the other hand, a Si-Ge layer is deposited over the gate electrode to react with the metal deposited thereon for subsequently forming a Ge-salicide layer. The required temperature of forming a Ge-salicide layer and the impedance of the Ge-salicide layer in accordance the present invention are both lower than the salicide layer formed by the conventional method.

The method of forming a thin film transistor comprises the following steps. Firstly, a buffer layer and a amorphous thin film are formed on an insulating substrate. Then, a thermal process is performed to transfer the amorphous thin film to the polycrystalline thin film and define an active area on the polycrystalline thin film. Next, an insulating layer, an amorphous silicon layer, an amorphous silicon germanium layer and a photoresist layer are sequentially deposited on said buffer layer and said active area. The insulating layer serves as a gate dielectric layer and the amorphous silicon layer and the amorphous silicon germanium layer serves as a gate electrode. Then, a light is projected onto the back side to pattern the photoresist layer using the active area as a mask and etch the insulating layer, the amorphous silicon germanium layer and the amorphous silicon layer to form the gate electrode and gate dielectric while using the photoresist pattern as a mask. Next, ions are implanted into the active area to form a source/drain region while using the gate electrode as a mask. Then, a conductive layer is formed on the surface and a thermal process is performed to make said conductive layer react with said gate electrode and said source/drain region to form a low impedance Ge-salicide. Finally, un-reacted conductive layer is removed.

An amorphous silicon germanium layer is not deposited on the buffer layer in another embodiment of the present invention. Ge ions are implanted into the amorphous silicon layer to provide the Ge component to react with the conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the method proposed in the present invention is illustrated with one preferred embodiment of forming a TFT apparatus. Skill artisans, upon acknowledging the embodiments, can apply the present invention to any kind of TFT apparatus to eliminate the drawbacks of using the two photomasks to define the active area and gate electrode. This increases not only the process cycle time and cost required to manufacture the TFT device but also the opportunity for misalignment between the active area and gate electrode. On the other hand, a Si-Ge layer is deposited over the gate electrode to react with the metal deposited thereon after for forming a Ge-salicide layer. The method in accordance the present invention may reduce the required temperature of forming a Ge-salicide layer and the impedance of the Ge-salicide layer. The usage of the present invention is not limited by the embodiments as follows.

THE FIRST EMBODIMENT

Figure 1:
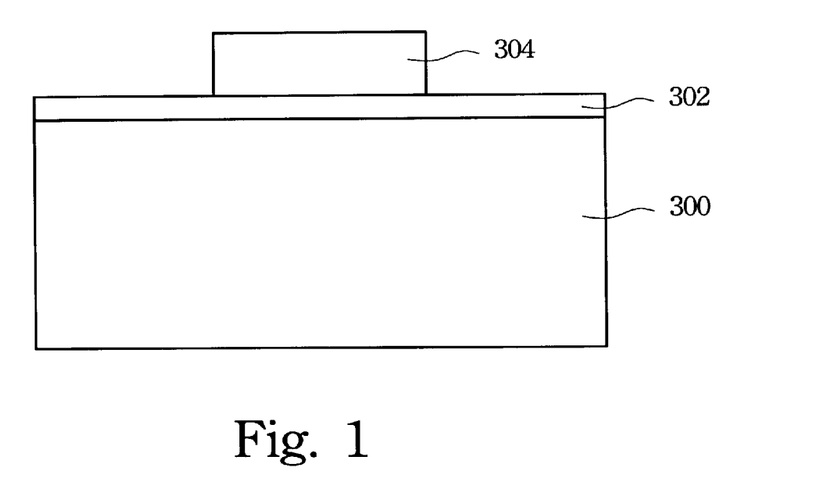
FIG. 1 to FIG. 6 are schematic cross-sectional views of the process of forming a thin film transistor (TFT) method in accordance with the first embodiment of the present invention.

The present invention discloses a fabrication method for forming a TFT apparatus having a low serial impedance. With reference to FIG. 1, a buffer layer 302 and an amorphous thin film (not shown in the figure) are in turn formed on a insulating transparent substrate 300. A laser annealing method is used to transfer the amorphous thin film to polycrystalline thin film. Then, a patterned photoresist layer (not shown in the figure) is formed over the polycrystalline thin film as a mask to etch the polycrystalline thin film to define the active area 304 of the TFT. Next, the patterned photoresist layer is removed.

In accordance with the first embodiment, the insulating transparent substrate 300 is glass or quartz. The material of buffer layer 302 is silicon oxide ($Si_xO_y$), silicon nitride ($Si_xN_y$) or a combination thereof. The buffer layer 302 is formed over the insulating transparent by physical vapor deposition (PVD), low pressure chemical vapor deposition (LPCVD) or plasma enhanced chemical vapor deposition (PECVD). The material of active area 304 could be amorphous silicon, amorphous germanium or amorphous silicon-germanium thin film and the deposition method is low pressure chemical vapor deposition (LPCVD) or plasma enhanced chemical vapor deposition (PECVD). The thickness of the active area 304 is about 500 to 1000 angstroms.

Figure 2:
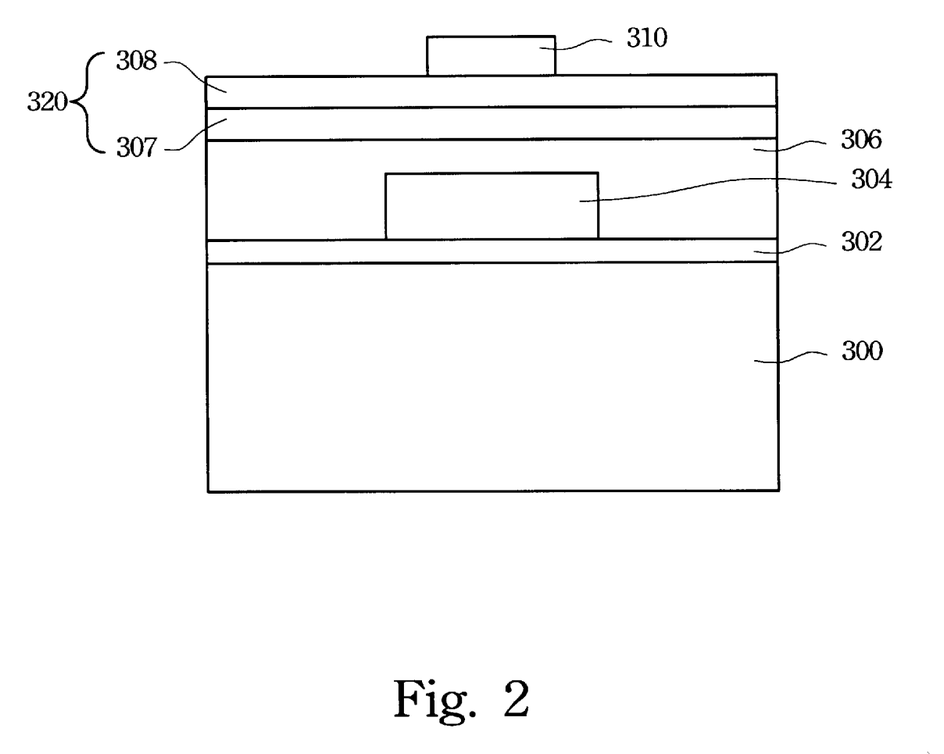

Next, as seen in FIG. 2, a insulating layer 306, an amorphous silicon (a-Si) layer 307, an amorphous silicon-germanium layer (a-SiGe) 308 and a photoresist layer 310 are sequentially formed on the buffer layer 302 and active area 304. Then, light rays are projected on the back side of the transparent substrate 300 to perform a lithography process on the photoresist layer 310 while using the active area 304 of the TFT as a hard mask. The back-side exposure may reduce photomask usage because the active area 304 of the TFT is used as a hard mask.

In accordance with the first embodiment, the insulating layer 306 is used as a gate dielectric. The material of the insulating layer 306 is silicon oxide ($Si_xO_y$), silicon nitride ($Si_xN_y$) or a combination thereof. The deposition method of the insulating layer 306 is physical vapor deposition (PVD), low pressure chemical vapor deposition (LPCVD) or plasma enhanced chemical vapor deposition (PECVD). The amorphous silicon (a-Si) layer 307 and the amorphous silicon-germanium layer (a-SiGe) 308 are used as the gate electrode and the deposition method is low pressure chemical vapor deposition (LPCVD) or plasma enhanced chemical vapor deposition (PECVD). In addition, the total thickness of the amorphous silicon layer 307 and the amorphous silicon-germanium layer 308 is about 1000 to 3000 angstroms.

Figure 3:
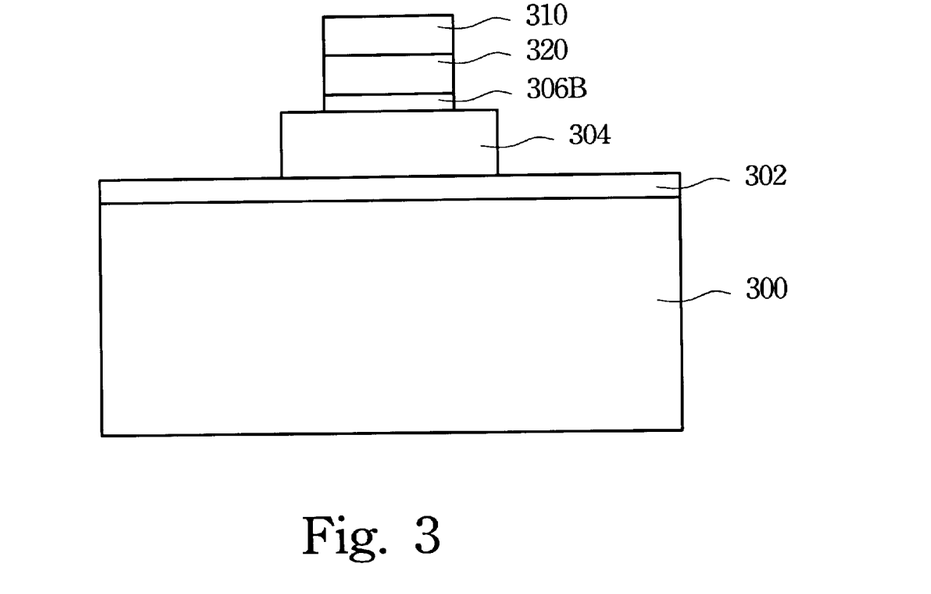

Referring to FIG. 3, a dry etching process is performed to remove a portion of the insulating layer 306, the amorphous silicon layer 307 and the amorphous silicon-germanium layer 308 while using the photoresist layer 310 as a mask. The gate electrode 320 and gate dielectric layer 306B will be formed after this step. Then, the photoresist 310 is removed.

Figure 4:
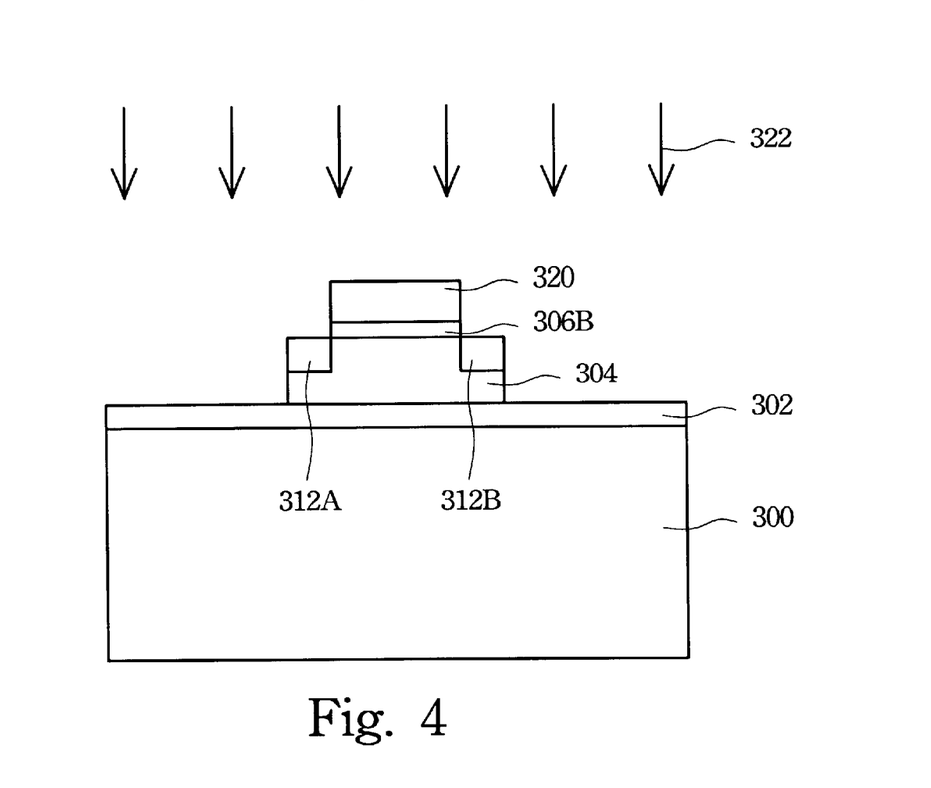

Referring to FIG. 4, an N-type or P-type ion implantation, in the direction of arrows 322, is performed on the active area 304 while using the gate electrode 320 as a mask to form the two heavily doped layers 312A and 312B to serve as source/drain regions. The source/drain region is located under the gate dielectric layer 306B and the area between the source and drain region serves as a channel of the TFT.

Figure 5:
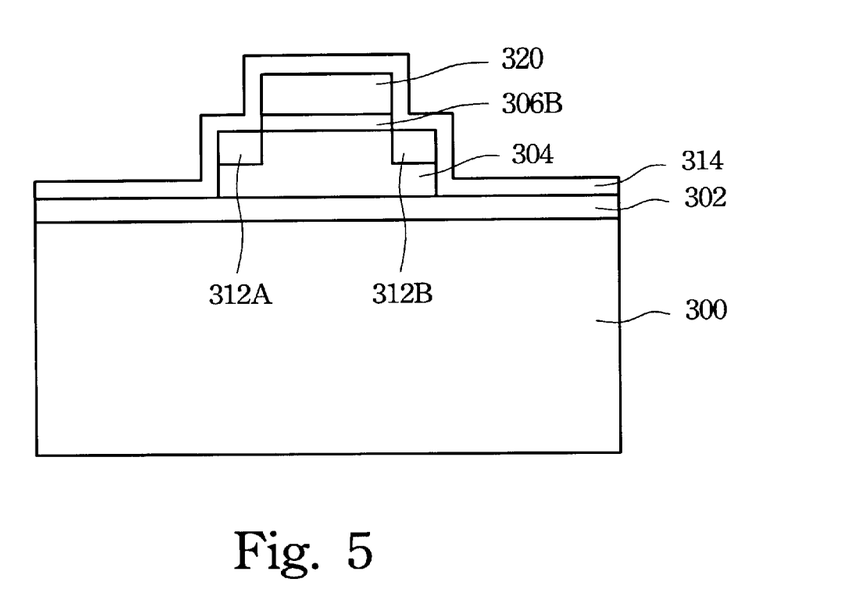

As shown in FIG. 5, a conductive layer 314 is formed on the buffer layer 302, the two heavily doped layers 312A and 312B and the gate electrode 320. The thickness of the conductive layer 314 is about 10 nm. In accordance with the first embodiment, the conductive layer 314 material is Ni, Ti, Co or a combination thereof. The deposition method of the conductive layer 314 is physical vapor deposition (PVD).

Figure 6:
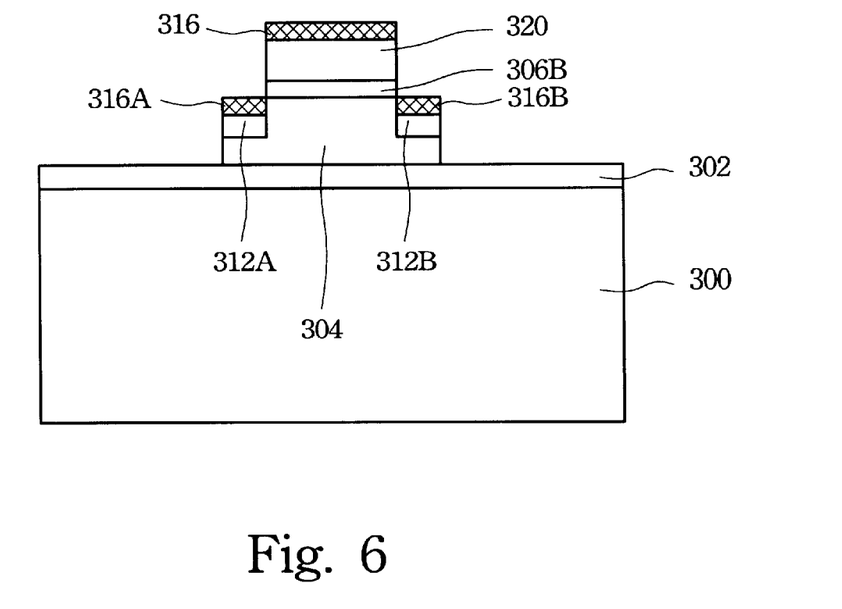

Referring to FIG. 6, next, a thermal process with a temperature about 300 to 600° C. is applied to the TFT. The contact surfaces between the two heavily doped layers 312A and 312B and the conductive layer 314 form two salicide layers 316A and 316B and the thickness is about 100 to 300 angstroms. The contact surface between the gate electrode 320 and the conductive layer 314 form a Ge-salicide layer 316 and the thickness is about 100 to 300 angstroms. The forgoing thermal process is performed in a furnace. Then, an etching process is performed to remove the un-reacted conductive layer 314. A thin film transistor with low serial impedance and self-aligned gate electrode is finished.

THE SECOND EMBODIMENT

Figure 7:
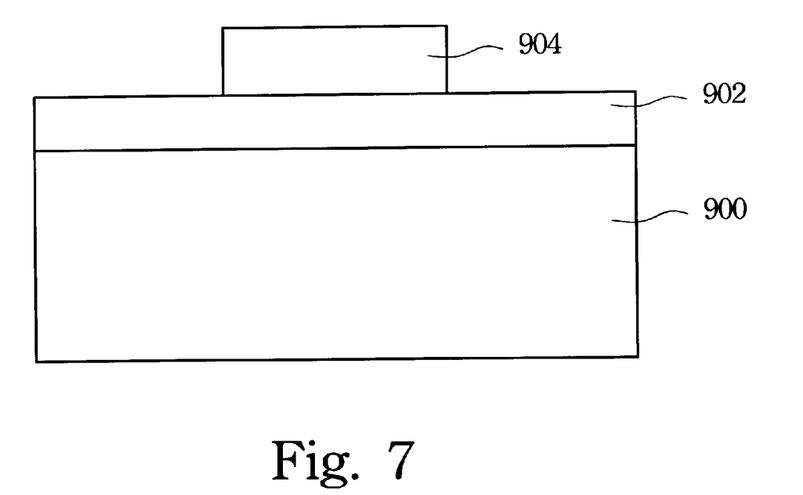
FIG. 7 to FIG. 13 are schematic cross-sectional views of the process of forming a thin film transistor (TFT) method in accordance with the second embodiment of the present invention.

The second embodiment describes another kind of manufacturing method. As shown in FIG. 7, a buffer layer 902 and an amorphous thin film (not shown in the figure) are formed on a insulating transparent substrate 900 and then an active area 904 is defined over the buffer layer 902. The definition method is the same method as described in FIG. 1.

Figure 8:
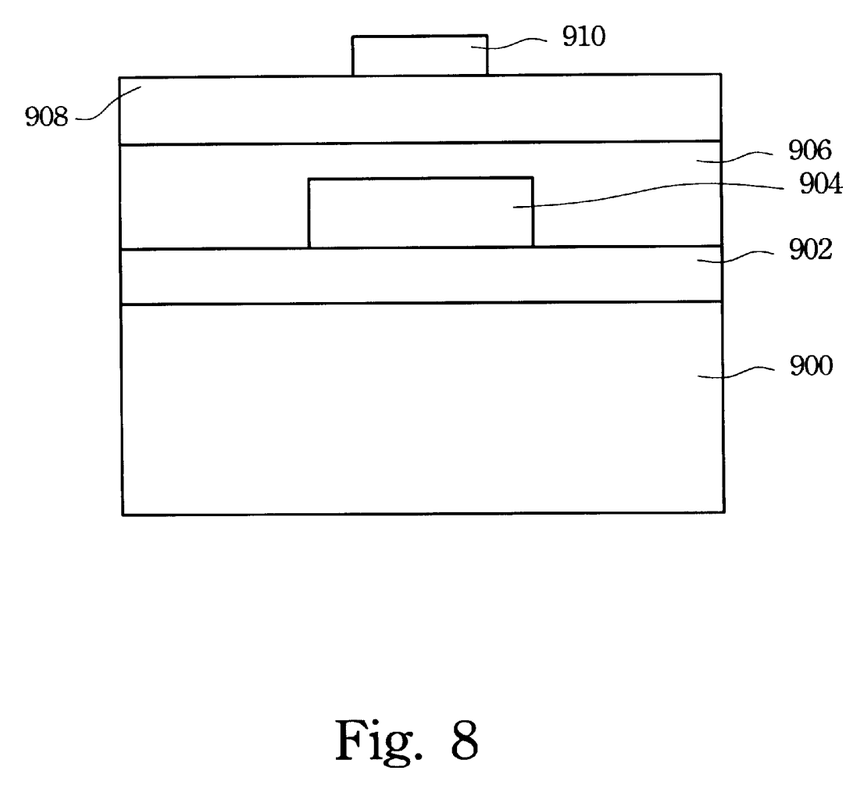

Next, as seen in FIG. 8, a insulating layer 906, an amorphous silicon (a-Si) layer 908 and a photoresist layer 910 are sequentially formed on the buffer layer 902 and active area 904. Then, light rays are projected from the back side of the transparent substrate 900 to give perform lithography on the photoresist layer 910 while using the active area 904 of the TFT as a hard mask. The back-side exposure may reduce photomask usage because the active area 904 of the TFT is used as a hard mask.

In accordance with the second embodiment, the insulating layer 906 is used as a gate dielectric. The material of the insulating layer 906 is silicon oxide ($Si_xO_y$), silicon nitride ($Si_xN_y$) or a combination thereof. The deposition method of the insulating layer 906 is physical vapor deposition (PVD), low pressure chemical vapor deposition (LPCVD) or plasma enhanced chemical vapor deposition (PECVD). The amorphous silicon (a-Si) layer 908 are used as the gate electrode and the deposition method is low pressure chemical vapor deposition (LPCVD) or plasma enhanced chemical vapor deposition (PECVD). In addition, the thickness of the insulating layer 906 is about 1000 to 3000 angstroms. The thickness of the amorphous silicon layer 908 is about 500 to 1000 angstroms.

Figure 9:
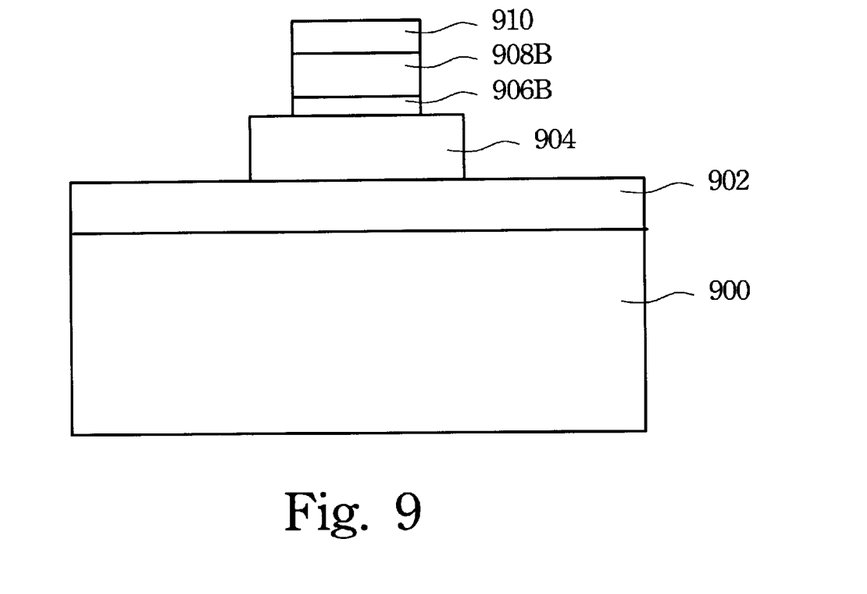

Referring to FIG. 9, a dry etching process is performed to remove a portion of the insulating layer 906 and the amorphous silicon layer 908 while using the photoresist layer 910 as a mask. The gate electrode 908B and gate dielectric layer 906B will be formed after this etching step. Then, the photoresist 910 is removed.

Figure 10:
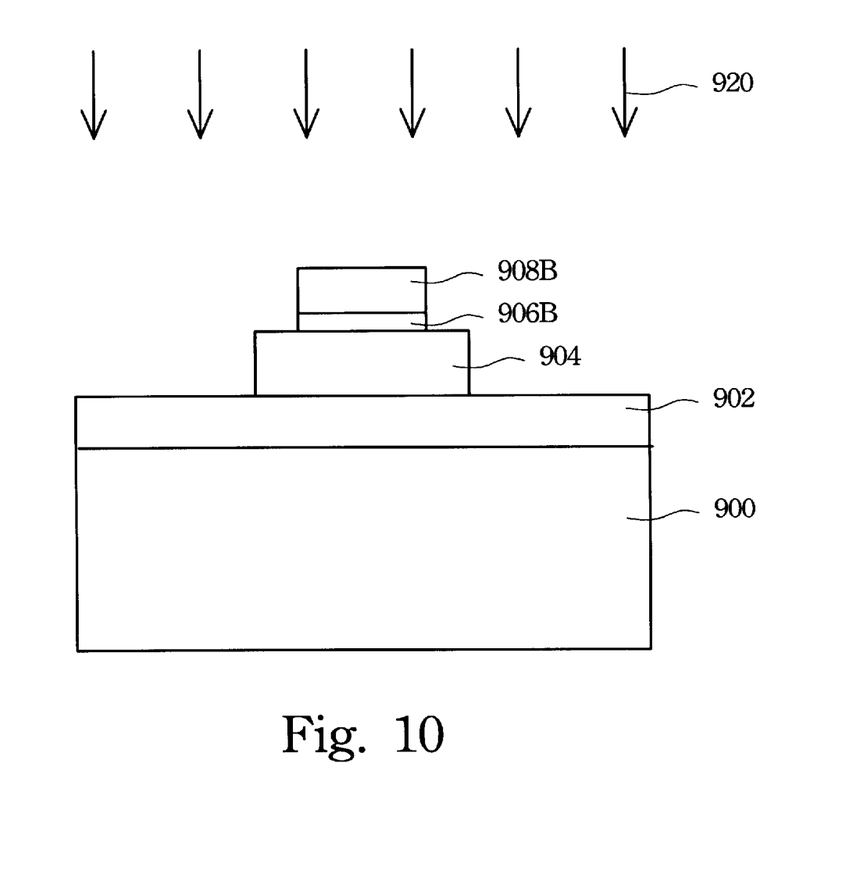

Referring to FIG. 10, the germanium (Ge) ion implantation, in the direction of arrows 920, is performed to form the Ge doped layers. In accordance with the present invention, a Si-Ge layer is used to react with the conductive layer deposited thereon for subsequently forming a Ge-salicide layer. The method may reduce the required temperature of forming a Ge-salicide layer. At the same time, the impedance of the Ge-salicide layer is lower than the salicide layer; therefore, the present invention may eliminate the problems faced by the conventional method.

Figure 11:
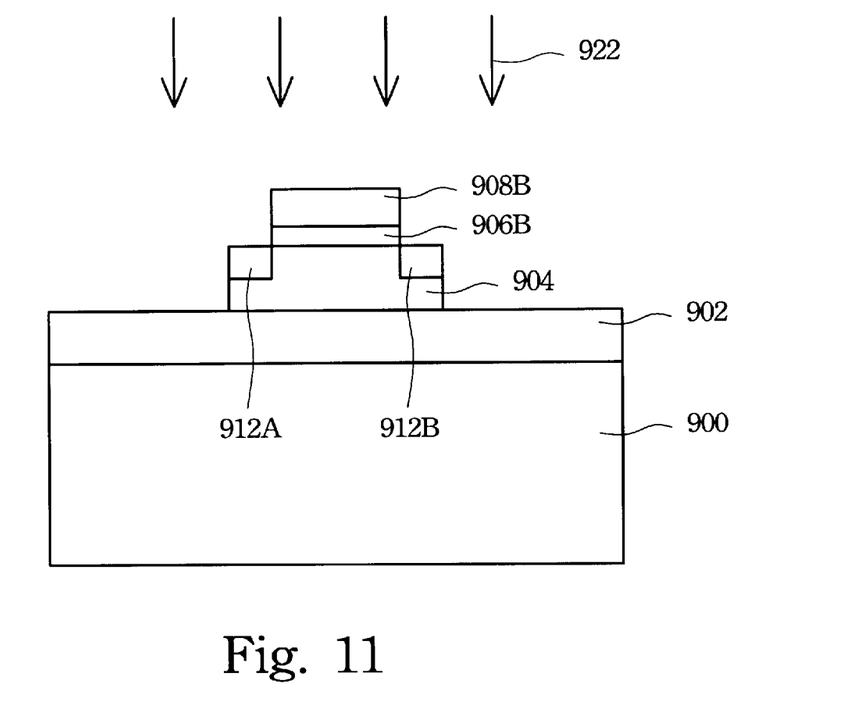

Referring to FIG. 11, an N-type or P-type ion implantation, in the direction of arrows 922, is performed on the active area 904 while using the gate electrode 908 as a mask to form the two heavily doped layers 912A and 912B to serve as source/drain regions. The source/drain region is located under the gate dielectric layer 906 and the area between the source and drain region serves as a channel of the TFT. Preferably, the energy and the dosage of the ion implantation are about 10 to 100 keV and about $10^{16}/cm^2$, respectively.

Figure 12:
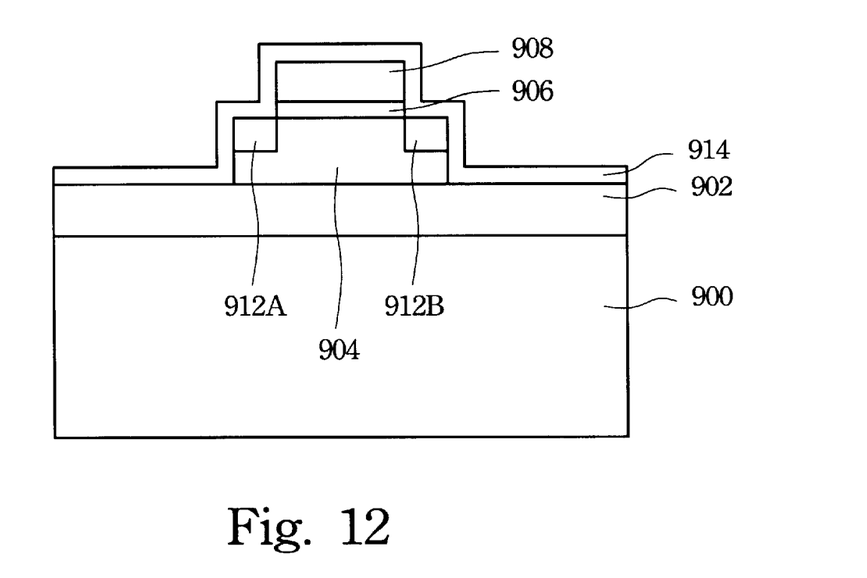

As shown in FIG. 12, a conductive layer 914 is formed on the buffer layer 902, the two heavily doped layers 912A and 912B and the gate electrode 908. The thickness of the conductive layer 914 is about 10 nm. In accordance with the second embodiment, the conductive layer 914 material is Ni, Ti, Co or a combination thereof. The deposition method of the conductive layer 314 is physical vapor deposition (PVD).

Figure 13:
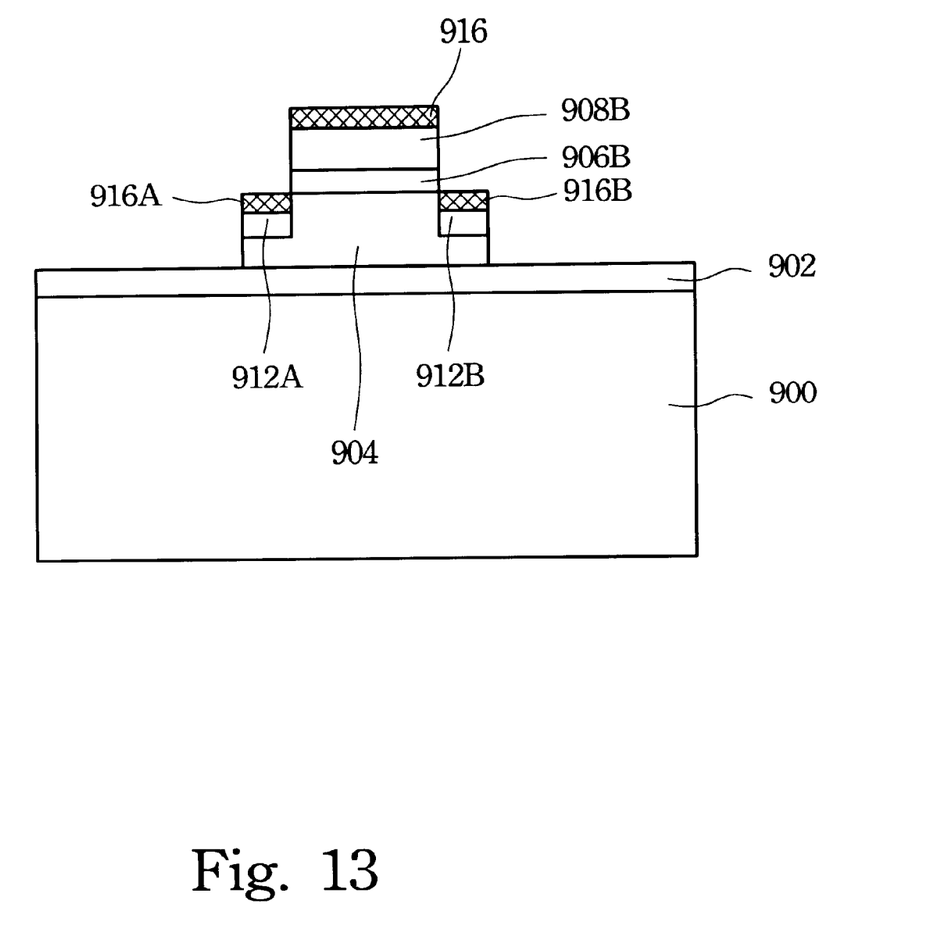

Referring to FIG. 13, next, a thermal process with a temperature of about 300 to 600° C. is applied to the TFT. The contact surfaces between the two heavily doped layers 912A and 912B and the conductive layer 914 forms two salicide layers 916A and 916B and the thickness is about 100 to 300 angstroms. The contact surface between the gate electrode 908 and the conductive layer 914 forms a Ge-salicide layer 916 having a thickness of about 100 to 300 angstroms. The forgoing thermal process is performed in a furnace. Then, an etching process is performed to remove the un-reacted conductive layer 914. A thin film transistor with low serial impedance and a self-aligned gate electrode are finished.

As in the foregoing description, the Ge components are provided by performing a Si-Ge thin film deposition in the first embodiment. However, the Ge components are provided by performing a Ge ion implant into the deposited amorphous silicon layer in the second embodiment.

The more photomasks are used in manufacturing TFT, the more process cycle time and cost are required. The misalignment risk is also increased. In accordance with the conventional manufacturing method, two different photomasks are needed to define the active area and the gate electrode, which may often cause electrical failure. Therefore, the present invention provides a method for manufacturing a TFT-LCD apparatus. It uses a back-side exposure method using the active area as a mask to form the gate electrode, not using another photomask. Therefore, the present invention method may reduce the cost and eliminate the misalignment risk.

On the other hand, it is necessary for manufacturing TFT devices to have the lower serial impedance for reducing the power loss among the source/gate/drain electrode. The conventional method for reducing the impedance is to form a salicide layer over the source/gate/drain electrode. A metal layer is deposited over the source/gate/drain electrode and then a thermal process is performed to make the silicon portion of the source/gate/drain electrode react with the metal. However, a temperature of over 500° C. is required to manufacture low impedance salicide. This kind of process temperature will break the glass substrate. Therefore, the present invention uses the Si-Ge thin film to react with the conductive layer to eliminate the high reaction temperature problem. At this time, the Ge-salicide layer has a low serial impedance; therefore, it also may improve the high impedance problem.

As a whole, the present invention can provide various benefits. First, only one lithography step, namely only one photomask, is required to manufacture the TFT device when using the method provided in this invention. Thus, the complexity, the cost and the cycle time of the process for forming the TFT device are lowered. In additional, the Si-Ge thin film replaces the Si thin film to react with the conductive layer. Accordingly, the high reaction temperature and high impedance problems may be eliminated.

As is understood by a person skilled in the art, the foregoing preferred embodiment of the present invention is illustrative rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method of forming a thin film transistor, said method comprises the following steps of:

forming a buffer layer on an insulating substrate;

forming a polycrystalline thin film on said buffer layer;

forming a fist photoresist pattern on said polycrystalline thin film;

etching said polycrystalline thin film to form an active area while using said first photoresist pattern as a mask;

removing said first photoresist pattern;

forming an insulating layer on said buffer layer and said active area;

forming an amorphous silicon layer on said insulating layer;

forming an amorphous silicon germanium layer on said amorphous silicon layer;

forming a second photoresist pattern on said amorphous silicon germanium layer;

projecting light through a back side of said insulating substrate to pattern said second photoresist layer while using said active area as a mask;

etching said insulating layer, said amorphous silicon germanium layer and said amorphous silicon layer to form an gate electrode while using said second photoresist pattern as a mask;

removing said second photoresist pattern;

performing an ion implantation into said active area to form a source/drain region using said gate electrode as a mask;

forming a conductive layer on said gate electrode, said source/drain region and said buffer layer;

performing a thermal process to make said conductive layer react with said gate electrode and said source/drain region; and removing un-reacted portions of said conductive layer.

2. The method of claim 1, wherein said insulating substrate is comprised of a material selected from a group consisting of glass and quartz.

3. The method of claim 1, wherein said buffer layer is comprised of a material selected from a group consisting of $Si_xN_y$ and $Si_xO_y$ and a combination thereof.

4. The method of claim 1, wherein said buffer layer is formed by physical vapor deposition (PVD), low pressure chemical vapor deposition (LPCVD) or plasma enhanced chemical vapor deposition (PECVD).

5. The method of claim 1, wherein said step of forming the polycrystalline thin film further comprises:
   forming an amorphous thin film on said buffer layer; and
   performing an annealing step to transfer said amorphous thin film to the polycrystalline thin film.

6. The method of claim 5, wherein said amorphous thin film is selected from a group consisting of amorphous silicon, amorphous germanium and amorphous silicon germanium thin film.

7. The method of claim 5, wherein said amorphous thin film is formed by low pressure chemical vapor deposition (LPCVD) or plasma enhanced chemical vapor deposition (PECVD).

8. The method of claim 1, wherein said insulating layer is selected from a group consisting of $Si_xN_y$, $Si_xO_y$, and a combination thereof.

9. The method of claim 1, wherein the layer is formed by physical vapor deposition (PVD), low pressure chemical vapor deposition (LPCVD) or plasma enhanced chemical vapor deposition (PECVD).

10. The method of claim 1, wherein said conductive layer is selected from a group of consisting of Ni, Co, Ti and alloy.

11. The method of claim 1, wherein said conductive layer is formed by physical vapor deposition (PVD).

12. The method of claim 1, wherein said thermal process is performed at a temperature of about 300 to 600° C.

13. The method of claim 1, wherein said amorphous silicon layer and said amorphous silicon-germanium layer together have a total thickness of about 500 to 1000 angstroms.

14. The method of claim 1, wherein N-type ions are implanted in said ion implantation step.

15. The method of claim 1, wherein P-type ions are implanted in said ion implantation step.

16. A method of forming a thin film transistor, said method comprising the following steps of:
   forming a buffer layer on an insulating substrate;
   forming a polycrystalline thin film on said buffer layer;
   forming a first photoresist pattern on said polycrystalline thin film;
   etching said polycrystalline thin film to form an active area while using said first photoresist pattern as a mask;
   removing said first photoresist pattern;
   forming an insulating layer on said buffer layer and said active area;
   forming an amorphous silicon layer on said insulating layer;
   forming a second photoresist pattern on said amorphous silicon layer;
   projecting light through a back side of said insulating substrate to pattern said second photoresist layer while using said active area as a mask;
   etching said insulating layer and said amorphous silicon layer to form a gate electrode while using said second photoresist pattern as a mask;
   removing said second photoresist pattern;
   performing a Ge ion implant into said gate electrode and said active area;
   performing second ion implant into said active area to form a source/drain region;
   forming a conductive layer on said gate electrode, said source/drain region and said buffer layer;
   performing a thermal process to make said conductive layer react with said gate electrode and said source/drain region; and
   removing un-reacted portions of said conductive layer.

17. The method of claim 16, wherein said insulating substrate is comprised of a material selected from a group consisting of glass and quartz.

18. The method of claim 16, wherein said buffer layer is comprised of a material selected from a group consisting of $Si_xN_y$, $Si_xO_y$, and a combination thereof.

19. The method of claim 16, wherein said buffer layer is formed by physical vapor deposition (PVD), low pressure chemical vapor deposition (LPCVD) or plasma enhanced chemical vapor deposition (PECVD).

20. The method of claim 16, wherein said step of forming polycrystalline thin film further comprises:
   forming an amorphous thin film on said buffer layer; and
   performing an annealing step to transfer said amorphous thin film to polycrystalline thin film.

21. The method of claim 20, wherein said amorphous thin film is selected from a group consisting of amorphous silicon, amorphous germanium and amorphous silicon germanium thin film.

22. The method of claim 20, wherein said amorphous thin film is formed by low pressure chemical vapor deposition (LPCVD) or plasma enhanced chemical vapor deposition (PECVD).

23. The method of claim 16, wherein said insulating layer is selected from a group consisting of $Si_xN_y$, $Si_xO_y$, and a combination thereof.

24. The method of claim 16, wherein said insulating layer is formed by physical vapor deposition (PVD), low pressure chemical vapor deposition (LPCVD) or plasma enhanced chemical vapor deposition (PECVD).

25. The method of claim 16, wherein said conductive layer is selected from a group consisting of Ni, Co, Ti and alloy.

26. The method of claim 16, wherein said conductive layer is formed by physical vapor deposition (PVD).

27. The method of claim 16, wherein said thermal process is performed at a temperature of about 300 to 600° C.

28. The method of claim 16, wherein said amorphous silicon layer has a thickness of about 500 to 1000 angstroms.

29. The method of claim 16, wherein a dosage of said Ge ion implantation is about $10^{16}/cm^2$.

30. The method of claim 16, wherein said ion implant step implants N-type ions.

31. The method of claim 16, wherein said ion implant step implants P-type ions.

* * * * *